(12) United States Patent
Larsson et al.

(10) Patent No.: US 6,490,318 B1
(45) Date of Patent: *Dec. 3, 2002

(54) PHASE-COMPENSATING CONSTANT MODULUS ALGORITHM

(75) Inventors: Patrik Larsson, Matawan, NJ (US); Jean-Jacques Werner, Holmdel, NJ (US); Jian Yang, Marlboro, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/344,138

(22) Filed: Jun. 24, 1999

(51) Int. Cl.[7] .............................. H03H 7/30; H03H 7/40; H03K 5/159
(52) U.S. Cl. ..................... 375/232; 375/230; 375/233
(58) Field of Search ............................ 375/232, 233, 375/230

(56) References Cited

U.S. PATENT DOCUMENTS

| | | | | |
|---|---|---|---|---|
| 4,227,152 A | * | 10/1980 | Godard et al. | 375/231 |
| 5,263,033 A | * | 11/1993 | Seshadri | 714/792 |
| 5,506,871 A | * | 4/1996 | Hwang et al. | 375/230 |
| 5,646,957 A | * | 7/1997 | Im et al. | 375/233 |
| 5,694,423 A | | 12/1997 | Larsson et al. | 375/231 |
| 5,809,074 A | | 9/1998 | Werner et al. | 375/233 |
| 5,835,731 A | | 11/1998 | Werner et al. | 375/235 |
| 5,909,466 A | * | 6/1999 | Labat et al. | 375/233 |
| 5,970,093 A | * | 10/1999 | De Lantremange | 375/234 |
| 6,285,881 B1 | * | 9/2001 | Huang | 455/434 |
| 6,314,134 B1 | * | 11/2001 | Wener et al. | 375/232 |

OTHER PUBLICATIONS

U.S. Patent Application of Larsson, entitled "System and Method for Training A Plurality of Equalizers And A Modem Employing the System Or Method", Ser. No. 08/855,086, filed May 13, 1997.
U.S. Patent Application of Werner et al., entitled Blind Equalization Algorithm with Joint Use of the Constant Modulus Algorithm and the MultiModulus Algorithm, Ser. No. 09/066189, filed Apr. 24, 1998.
U.S. Patent Application of Werner et al., entitled "The Blind Equalization Algorithm with the Joint Use of the Constant R and the Sliced Symbols", Ser. No. XXX, filed on XXX.
Yang, J., Werner, J.J., and G. A. Dumont "The Multimodulus Blind Equalization Algorithm", Proceedings of DSP97, Santorini, Greece, 1997.

* cited by examiner

*Primary Examiner*—Chi Pham
*Assistant Examiner*—Tony Al-Beshrawi
(74) *Attorney, Agent, or Firm*—Steve Mendelsohn

(57) ABSTRACT

A receiver, comprising an adaptive filter, performs blind equalization using a modified form of the constant modulus algorithm (CMA). This modified form of CMA is referred to as phase compensating CMA (PC-CMA). PC-CMA includes a phase-compensating term in the tap updating algorithm of the equalizer such that convergence to a straight constellation is achieved without the need of a rotator.

22 Claims, 3 Drawing Sheets

PHASE-COMPENSATING CONSTANT MODULUS ALGORITHM

CROSS-RELATED TO RELATED APPLICATIONS

Related subject matter is disclosed in the commonly assigned, U.S. patent applications of: Larsson, entitled "System And Method For Training A Plurality Of Equalizers And A Modem Employing The System Or Method," Ser. No. 08/855,086, filed May 13, 1997 and issued as U.S. Pat. No. 6,088,389 on Jul. 11, 2000; Werner et al., entitled "Blind Equalization Algorithm with Joint Use of the Constant Modulus Algorithm and the MultiModulus Algorithm" Ser. No. 09/066,189, filed on Apr. 24, 1998 and issued as U.S. Pat. No. 6,314,134 B1 on Nov. 6, 2001; and Werner et al., entitled "The Blind Equalization Algorithm with the Joint Use of the Constant R and the Sliced Symbols" Ser. No. 09/339,793, filed on Jun. 24, 1999.

FIELD OF THE INVENTION

The present invention relates to communications equipment, and, more particularly, to blind equalization in a receiver.

BACKGROUND OF THE INVENTION

In blind equalization, the adaptive filters of a receiver are converged without the use of a training signal. As known in the art, there are two techniques for blind equalization: one is referred to herein as the "reduced constellation algorithm" (RCA) (e.g., see Y. Sato, "A Method of Self-Recovering Equalization for Multilevel Amplitude-Modulation Systems," *IEEE Trans. Commun.*, pp. 679–682, June 1975; and U.S. Pat. No. 4,227,152, issued Oct. 7, 1980 to Godard); and the other technique is the so-called "constant modulus algorithm" (CMA) (e.g., see D. N. Godard, "Self-Recovering Equalization and Carrier Tracking in Two-Dimensional Data Communications Systems," *IEEE Trans. Commun.*, vol. 28, no. 11, pp. 1867–1875, November 1980; and N. K Jablon, "Joint Blind Equalization, Carrier Recovery, and Timing Recovery for High-Order QAM Signal Constellations"*IEEE Trans. Signal Processing*, vol. 40, no. 6, pp. 1383–1398, 1992.) Further, U.S. Pat. No. 5,793,807, issued Aug. 11, 1998 to Werner et al., and entitled "Blind Equalization," presents a new blind equalization technique—the multimodulus algorithm (MMA)—as an alternative to the above-mentioned RCA and CMA approaches.

However, for all blind equalization approaches the most fundamental performance issue is the ability to achieve reliable initial convergence—else the adaptive filter may converge to a wrong solution such as the well-known "diagonal solution."

SUMMARY OF THE INVENTION

We have discovered a technique for use in blind equalization of an adaptive equalizer that reduces the rate of occurrence of a diagonal solution. In particular, and in accordance with the invention, a receiver performs blind equalization by using a tap updating algorithm that includes a phase-compensating term.

In an embodiment of the invention, a receiver comprises an adaptive filter having a two-filter structure. The receiver uses a modified form of the CMA algorithm to perform blind equalization. This modified form of CMA is referred to herein as phase compensating CMA (PC-CMA). PC-CMA includes a phase-compensating term in the tap updating algorithm of the equalizer such that convergence to a straight constellation is achieved without the need of a rotator.

DETAILED DESCRIPTION

Other than the inventive concept, the elements described below and shown in the FIGS. are well-known and will not be described in detail. Also, as used herein, an adaptive filter is, e.g., a fractionally spaced linear equalizer, which is hereafter simply referred to as an FSLE equalizer or, simply, an equalizer.

Figure 1:
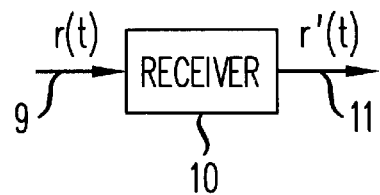
FIG. 1 is an illustrative block diagram of a portion of a communications system embodying the principles of the invention.

An illustrative high-level block diagram of a portion of a communications system embodying the principles of the invention is shown in FIG. 1. For illustrative purposes only, it is assumed that receiver 10 receives a CAP (carrierless, amplitude modulation, phase modulation) signal, which can be represented by:

$$r(t) = \sum_n [a_n p(t-nT) - b_n \tilde{p}(t-nT)] + \xi(t) \quad (1)$$

where $a_n$ and $b_n$ are discrete-valued multilevel symbols, $p(t)$ and $\tilde{p}(t)$ are impulse responses which form a Hilbert pair, T is the symbol period, and $\xi(t)$ is additive noise introduced in the channel (Additional information on a CAP communications system can be found in J. J. Werner, "Tutorial on Carrierless AM/PM—Part I—Fundamentals and Digital CAP Transmitter," Contribution to ANSI X3T9.5 TP/PMD Working Group, Minneapolis, Jun. 23, 1992.)

It is assumed that the CAP signal in equation (1) has been distorted while propagating through communications channel 9 and experiences intersymbol interference (ISI). This ISI consists of intrachannel ISI ($a_n$ or $b_n$ symbols interfering with each other) and interchannel ISI ($a_n$ and $b_n$ symbols interfering with each other). The purpose of receiver 10 is to remove the ISI and minimize the effect of the additive noise $\xi(t)$ to provide signal r'(t). The inventive concept is illustratively described in the context of a phase compensating CMA (PC-CMA) blind equalization algorithm for use within receiver At this point, before describing the inventive concept, a brief review is provided of adaptive filters and some blind equalization algorithms. If the reader is familiar with this background, simply skip-ahead to the section entitled "Phase Compensating CMA."

Adaptive Filters, and Blind Equalization

Figure 2:
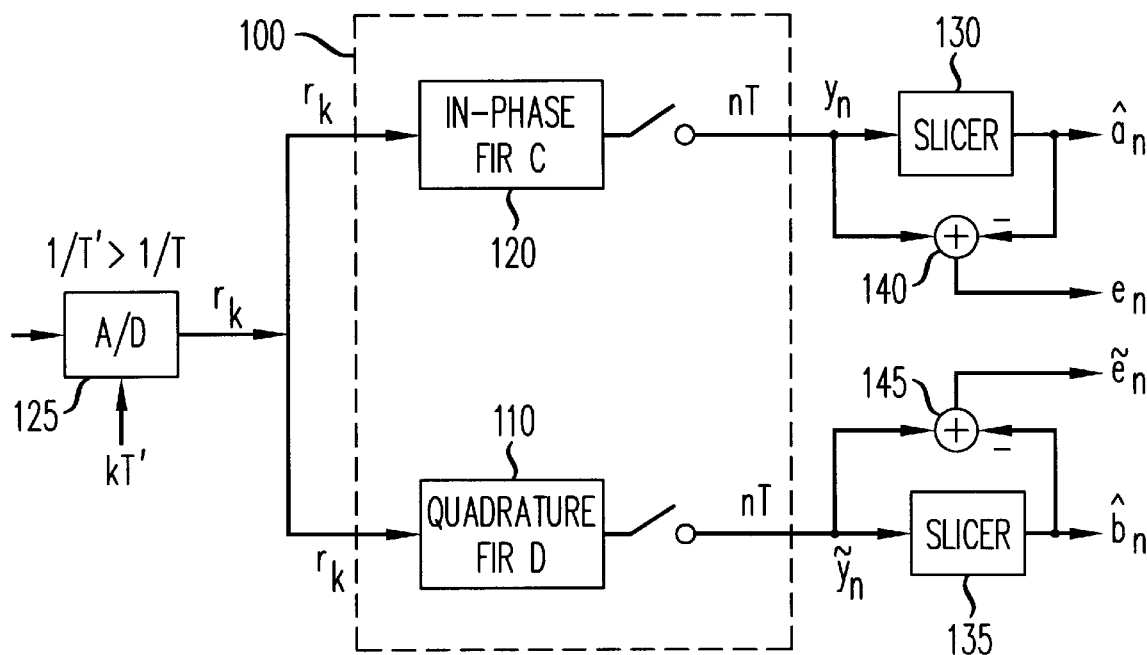
FIG. 2 is an illustrative block diagram of a prior art phase-splitting equalizer.
Figure 3:
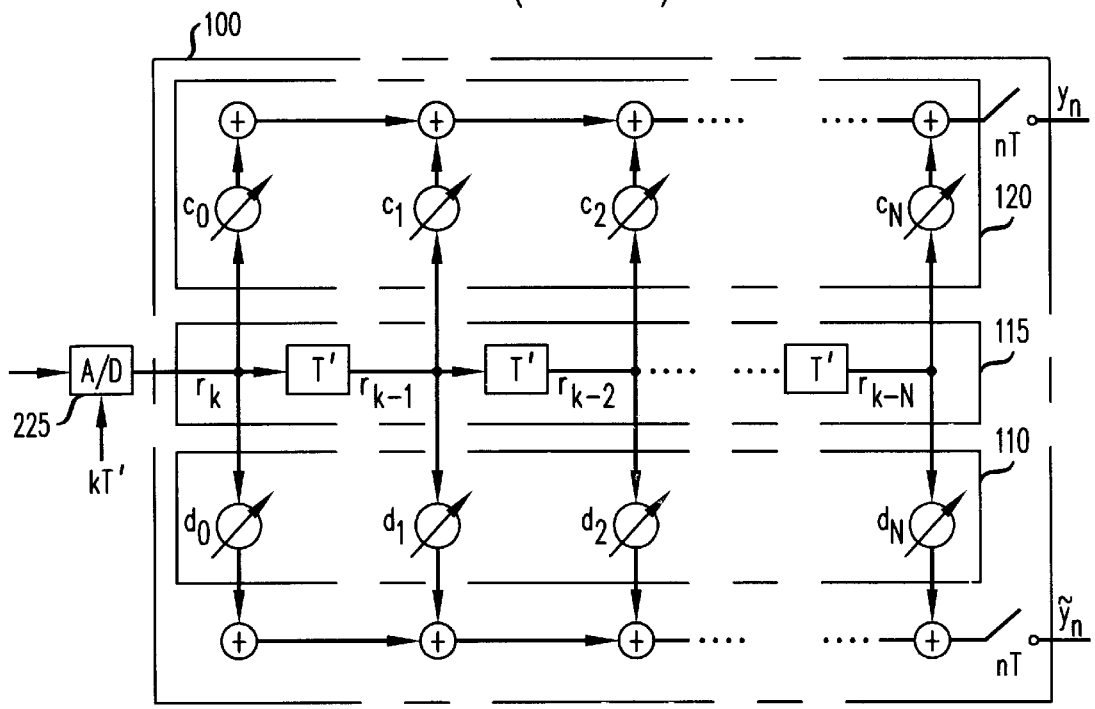
FIG. 3 is an illustrative block diagram of a portion of a prior art adaptive filter for use in an equalizer.

An illustrative phase-splitting FSLE equalizer 100 is shown in FIG. 2. It is assumed that FSLE equalizer 100 operates on an input signal that can be characterized as having N dimensions. In this example, N=2, i.e., the input signal comprises two component dimensions: an in-phase component and a quadrature component. (It should also be noted that the term "channel" may also be used to refer to each dimension, e.g., the in-phase dimension is also referred to as the in-phase channel) FSLE equalizer 100 comprises two parallel digital adaptive filters implemented as finite impulse response (FIR) filters 110 and 120. Equalizer 100 is called a "phase-splitting FSLE" because the two FIR filters 110 and 120 converge to in-phase and quadrature filters. Some illustrative details of the equalizer structure are shown in FIG. 3. The two FIR filters 110 and 120 share the same tapped delay line 115, which stores sequences of successive Analog-to-Digital Converter (A/D) 125 samples $r_k$. The sampling rate 1/T' of A/D 125 is typically three to four times higher than the symbol rate 1/T and is chosen in such a way that it satisfies the sampling theorem for real signals. It is assumed that T/T'=i, where i is an integer.

The output signals of the two adaptive FIR filters 110 and 120 as shown in FIG. 3 are computed at the symbol rate 1/T. The equalizer taps and input samples can be represented by a corresponding N-dimensional vector. As such, the following relationships are now defined:

$$r_n^T[r_k, r_{k-1}, \ldots, r_{k-N}] = \text{vector of A/D samples in delay line;} \quad (2)$$

$$c_n^T[c_0, c_1, c_2, \ldots, c_N] = \text{vector of in-phase tap coefficients; and} \quad (3)$$

$$d_n^T[d_0, d_1, d_2, \ldots, d_N] = \text{vector of quadrature phase tap coefficients; and} \quad (4)$$

where the superscript T denotes vector transpose, the subscript n refers to the symbol period nT, and k=(i)(n).

Let $y_n$ and $\tilde{y}_n$ be the computed output signals of the in-phase and quadrature filters, respectively, and:

$$y_n = c_n^T r_n; \text{ and} \quad (5)$$

$$\tilde{y}_n = d_n^T r_n. \quad (6)$$

An X/Y display of the output signals $y_n$ and $\tilde{y}_n$ or, equivalently, of the complex output signal $Y_n = y_n + j\tilde{y}_n$, is called a signal constellation. After convergence, ideally the signal constellation consists of a display of the complex symbols $A_n = a_n + jb_n$ (which were sent from the transmitter) corrupted by some small noise and ISI.

Referring back to FIG. 2, FSLE equalizer 100 can be characterized as having two modes of operation, a normal mode (steady state) and a start-up mode (non-steady state). In the normal mode of operation, the decision devices, i.e., slicers 130 and 135, compare the equalizer complex output samples, $Y_n$, (where $Y_n = y_n + j\tilde{y}_n$), with all the possible transmitted complex symbols, $A_n$ (where $A_n = a_n + jb_n$), and select the symbol $\hat{A}_n$ which is the closest to $Y_n$. The receiver then computes an error, $E_n$, where $E_n = f(Y_n, \hat{A}_n)$. For example:

$$E_n = Y_n - \hat{A}_n, \quad (7)$$

which is used to update the tap coefficients of equalizer 100. The most common tap updating algorithm is the LMS algorithm, which is a stochastic gradient algorithm that minimizes the mean square error (MSE), which is defined as:

$$MSE \triangleq E[|E_n|^2] = E[|Y_n - \hat{A}_n|^2] = E[e_n^2] + E[\tilde{e}_n^2]. \quad (8)$$

In equation (8), E[.] denotes expectation and $e_n$ and $\tilde{e}_n$ are the following in-phase and quadrature errors:

$$e_n = y_n - \hat{a}_n, \text{ and} \quad (9)$$

$$\tilde{e}_n = \tilde{y}_n - \hat{b}_n. \quad (10)$$

The tap coefficients of the two adaptive filters are updated using the above-mentioned least-mean-square (LMS) algorithm, i.e., $$c_{n+1} = c_n - \alpha e_n r_n, \text{ and} \quad (11)$$

$$d_{n+1} = d_n - \alpha \tilde{e}_n r_n, \quad (12)$$

where $\alpha$ is the step size used in the tap adjustment algorithm.

In contrast to the steady state mode of operation, the start-up mode is used to converge the tap coefficient values to an initial set of values. In some systems a training sequence is used during start-up (i.e., a predefined sequence of $A_n$ symbols), from which the receiver can compute meaningful errors $E_n$ by using the equalizer output signal $Y_n$ and the known sequence of transmitted symbols $A_n$. In this case, tap adaptation is said to be done with respect to an "ideal reference."

However, when no training sequence is available, equalizer 100 has to be converged blindly. This usually comprises two main steps. First, a blind equalization algorithm is used to open the "eye diagram," i.e., achieve initial convergence. Then, once the eye is open enough, the receiver switches to, e.g., the above-described LMS tap adaptation algorithm to obtain final steady-state convergence. The switch between the two kinds of algorithms are controlled by so called schedule-driven or event-driven counters (e.g., see the above-mentioned U.S. Pat. No. 5,809,074 issued to Werner et al.). The philosophy of blind equalization is to use a tap adaptation algorithm that minimizes a cost function that is better suited to provide initial convergence of equalizer 100 than the MSE represented by equation (8).

The cost functions used for blind equalization algorithms and the LMS algorithm minimizes different quantities. As see in equation (8), the cost function of the LMS algorithm is given as:

$$CF = E[|Y_n - \hat{A}_n|^2]. \quad (13)$$

In equation (13), the LMS algorithm uses the sliced symbols, $\hat{A}_n$, to achieve convergence. However, with a blind start-up, due to the severe corruption of data, the cost functions used for blind equalization algorithms need to use a constant R, which is statistically related to the sliced symbols $\hat{A}_n$. For instance, the cost function of CMA is $$CF = E[(|Y_n|^2 - R^2)^2]. \quad (14)$$

(Illustrative techniques for the computation of R can be found in, e.g., U.S. Pat. No. 5,793,807, issued Aug. 11, 1998 to Werner et al., entitled "Multimodulus blind equalization using piecewise linear contours.")

For CMA, the tap coefficients of the two adaptive filters are updated according to:

$$c_{n+1} = c_n - \mu y_n (|Y_n|^2 - R^2) r_n; \text{ and} \quad (15)$$

$$d_{n+1} = d_n - \mu \tilde{y}_n (|Y_n|^2 - R^2) r_n. \quad (15)$$

The two-dimensional CMA cost function does not contain any information about the phase rotation of the constellation. Thus, it leaves an arbitrary phase offset after convergence. One proposed solution is to include a rotator and a counter-rotator after the equalizer (e.g., see the above-mentioned article by D. N. Godard). The desired phase rotation is:

$$\Delta\hat{\theta}_n = Im\{Y'_n{}^*\hat{A}^*_n\}; \text{ and} \tag{17}$$

$$\hat{\theta}_{n+1} = \hat{\theta}_n - \alpha\Delta\hat{\theta} \text{hd n}; \tag{18}$$

where $\Delta\hat{\theta}_n$ is an estimate of the real phase error of the constellation, $Y'_n$ is the rotated equalizer output signal and $\hat{A}_n$ is the sliced complex symbol. The rotated equalizer output signal is further defined as:

$$Y'_n = Y_n e^{j\hat{\theta}_n} = C_n{}^T r_n e^{j\hat{\theta}_n}; \tag{19}$$

where $Y_n = y_n + j\tilde{y}_n$, $C_n = c_n + jd_n$. In matrix form, the function of the rotator/derotator is described by:

$$\begin{bmatrix} y'_n \\ \tilde{y}'_n \end{bmatrix} = \begin{bmatrix} \cos\hat{\theta}_n & -\sin\hat{\theta}_n \\ \sin\hat{\theta}_n & \cos\hat{\theta}_n \end{bmatrix} \begin{bmatrix} y_n \\ \tilde{y}_n \end{bmatrix}. \tag{20}$$

Equation (20) indicates that the rotator implementation requires evaluation of sine/cosine functions. Unfortunately, even after convergence with CMA (i.e., the equalizer has been switched to using a standard LMS tap adaptation algorithm for steady-state operation), a rotator is still needed—which results in a higher implementation cost for CMA compared to other blind equalization schemes that do not require rotators.

One approach for dispensing with the rotator was presented in P. Larsson, "Adaptive Phase Shifting in FIR filters with Application to Equalizers," pp. 1660–1664, 31$^{st}$ Asilomar Conference, CA. 1997. However, this algorithm is limited to fractional equalizers and is not an integral part of the updating.

Phase Compensating CMA (PC-CMA

As noted earlier, when blind equalization is used with an adaptive filter, e.g., a phase-splitting equalizer, sometimes it converges to a wrong solution called diagonal solutions. Therefore, and in accordance with the invention, we have discovered a technique for use in blind equalization of an adaptive equalizer that reduces the rate of occurrence of a diagonal solution. In particular, and in accordance with the invention, a receiver performs blind equalization by using a tap updating algorithm that includes a phase-compensating term.

The new blind equalization algorithm is called phase compensating CMA (PC-CMA. In PC-CMA, CMA is modified to use a tap updating algorithm that includes a phase-compensating term. Thus, rotation of a constellation is achieved for a CMA-based algorithm without the use of a rotator. Further, since the constellation rotation is embedded in the blind equalization algorithm, it will automatically be switched off when using the standard LMS algorithm in steady-state operation, which results in a lower steady-state cost than for traditional CMA.

From equation (19), we have realized that a phase-compensating rotation of the constellation can be achieved with an equalizer having tap weights described by $C'_n$ instead of a filter with taps $C_n$ followed by a rotator. That is, $$Y'_n = Y_n e^{j\hat{\theta}_n} = C_n{}^T r_n e^{j\hat{\theta}_n} = C'_n{}^T r_n; \tag{21}$$

where $C'_n{}^T = C_n{}^T e^{j\hat{\theta}_n}$.

The steps leading to an iterative gradient algorithm for converging the initial tap weights $C_n$ towards the final tap weights $C'_n$ are mathematically described below. Using equation (21), the rotated output $Y'_{n+1}$ is given by:

$$Y'_{n+1} = C_{n+1}{}^T r_{n+1} e^{j\hat{\theta}_{n+1}} = C'_{n+1}{}^T r_{n+1}. \tag{22}$$

Replacing the definition of $\hat{\theta}_{n+1}$ in equation (18), and using $C_{n+1} = C_n + \mu\Delta C_n$. equation (22) is rewritten as:

$$Y'_{n+1} = (C_n{}^T + \mu\Delta C_n{}^T) r_{n+1} e^{j\hat{\theta}_n} e^{-j\alpha\Delta\hat{\theta}_n}; \tag{23}$$

$$Y'_{n+1} = (C_n{}^T e^{j\hat{\theta}_n} + \mu\Delta C_n{}^T e^{j\hat{\theta}_n}) e^{-j\alpha\Delta\hat{\theta}_n} r_{n+1}; \tag{24}$$

$$Y'_{n+1} = (C'_n{}^T + \mu\Delta C'_n{}^T)(1 - j\alpha\Delta\hat{\theta}_n)^* r_{n+1}; \tag{25}$$

$$Y'_{n+1} = (C'_n{}^T + \mu\Delta C'_n{}^T - j\alpha C'_n{}^T \Delta\hat{\theta}_n - j\mu\alpha\Delta C_n{}^T \Delta\hat{\theta}_n)^* r_{n+1}; \tag{26}$$

which shows that the updating of the rotator can be replaced by an additional modification of the tap weights $C_n$. It should be noted that equation (25) uses the assumption that the step size parameter $\alpha$ is a small number such that the small-angle approximation holds, i.e., $$\cos(\alpha\Delta\hat{\theta}_n) \approx 1; \text{ and} \tag{27}$$

$$\sin(\alpha\Delta\hat{\theta}_n) \approx \alpha\Delta\hat{\theta}_n. \tag{28}$$

Neglecting the last term with a second-order quantity in equation (26), yields:

$$Y'_{n+1} = (C'_n{}^T + \mu\Delta C'_n{}^T - j\alpha C'_n{}^T \Delta\hat{\theta}_n)^* r_{n+1}. \tag{29}$$

The tap updating algorithm of the new equalizer, $C'_{n+1}$ is obtained from equations (22) and (29) as follows:

$$C'_{n+1} = C'_n + \mu\Delta C'_n - j\alpha C'_n \Delta\hat{\theta}_n. \tag{30}$$

Taking the real and imaginary parts of equation (30), the following adaptation algorithms for the in-phase and quadrature phase tap coefficients result:

$$c'_{n+1} = c'_n + \mu\Delta c'_n + \alpha d'_n \Delta\hat{\theta}_n; \text{ and} \tag{31}$$

$$d'_{n+1} = d'_n + \mu\Delta d'_n - \alpha c'_n \Delta\hat{\theta}_n. \tag{32}$$

The above equations show that the equalization and phase-rotating tap adaptation can be done simultaneously. Merging the standard CMA with the tap adaptation of equations (31) and (32) give the tap updating algorithms of PC-CMA as:

$$c'_{n+1} = c'_n + \mu y_n(|Y_n|^2 - R^2) r_n + \alpha d'_n \Delta\hat{\theta}_n; \text{ and} \tag{33}$$

$$d'_{n+1} = d'_n + \mu\tilde{y}_n(|Y_n|^2 - R^2) r_n - \alpha c'_n \Delta\hat{\theta}_n. \tag{34}$$

In the PC-CMA scheme, the de-rotation of a tilted constellation is done by the use of the $\Delta\hat{\theta}_n$ term in equations (33) and (34). This parameter is the same for both the in-phase (I) and quadrature (Q) channels such that both I and Q filters will de-rotate the constellation in the same direction, thus avoiding the diagonal solution. The value of the error correction term, or step size, $\mu$ in equations (33) and (34) is best determined by simulation.

Figure 4:
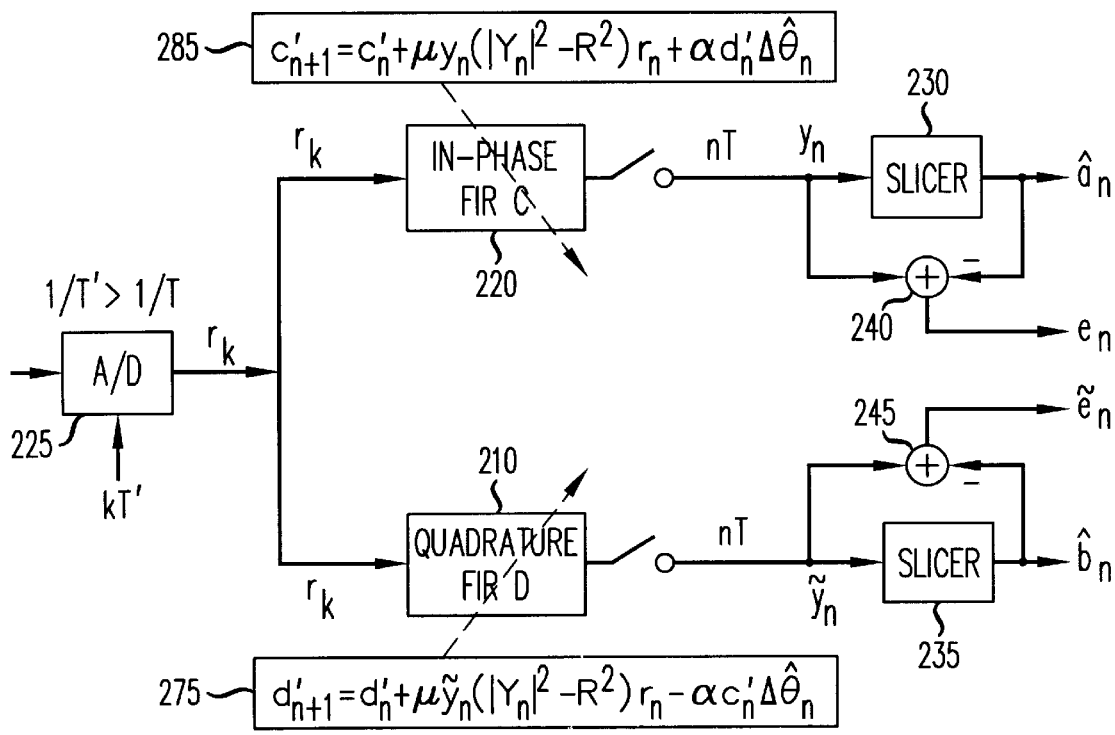
FIG. 4 shows an illustrative block diagram of a phase-splitting equalizer in accordance with the principles of the invention.

An illustrative block diagram of a phase-splitting equalizer in accordance with the principles of the invention is shown in FIG. 4. Except for the inventive concept, FIG. 4 is similar to FIG. 2 (described above) and as such will not be further described. As can be seen in FIG. 4, tap updating elements 275 and 285 (which represent equations (34) and (33)) update the coefficients of filters 210 and 220, respectively (as represented by the dashed arrows).

Figure 5:
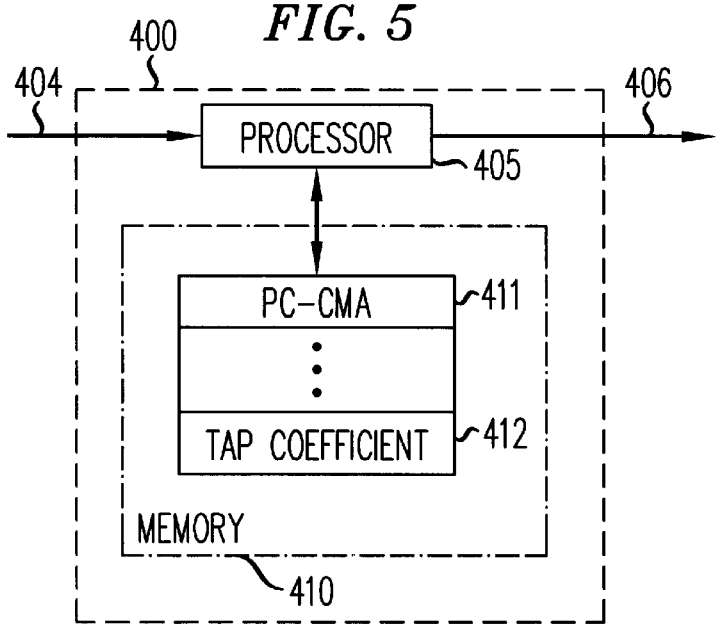
FIGS. 5 and 6 are illustrative block diagrams of a portion of a receiver embodying the principles of the invention.
Figure 6:
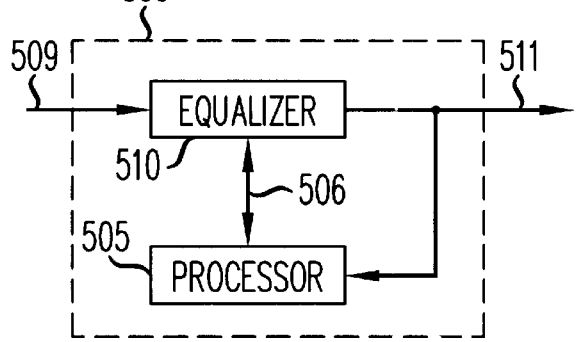

Illustrative embodiments of the inventive concept are shown in FIGS. 5 and 6 for use in receiver 10 of FIG. 1. FIG. 5 illustrates an embodiment representative of a digital signal processor 400 that is programmed to implement an FSLE in accordance with the principles of the invention. Digital signal processor 400 comprises a central processing unit (processor) 405 and memory 410. A portion of memory 410 is used to store program instructions that, when executed by processor 405, implement the PC-CMA algorithm. This portion of memory is shown as 411. Another portion of memory, 412, is used to store tap coefficient values that are updated by processor 405 in accordance with the inventive concept. It is assumed that a received signal 404 is applied to processor 405, which equalizes this signal in accordance with the inventive concept to provide a output signal 406. (As known in the art, it is assumed that received signal 404 is provided by an analog-to-digital (A/D) converter (not shown). Also, a digital signal processor may additionally process received signal 404 before deriving output signal 406.) An illustrative software program is not described herein since, after learning of the PC-CMA algorithm as described herein, such a program is within the capability of one skilled in the art. Also, it should be noted that any equalizer structures, such as that described earlier, can be implemented by digital signal processor 400 in accordance with the inventive concept.

FIG. 6 illustrates another alternative embodiment of the inventive concept. Circuitry 500 comprises a central processing unit (processor) 505, and an equalizer 510. The latter is illustratively assumed to be a phase-splitting FSLE as described above. It is assumed that equalizer 510 includes at least one tap-coefficient register for storing values for corresponding tap coefficient vectors (e.g., as shown in FIG. 3). Processor 505 includes memory, not shown, similar to memory 410 of FIG. 5 for implementing the PC-CMA algorithm. Equalizer output signal 511 is applied to processor 505. The latter analyzes equalizer output signal 511, in accordance with the inventive concept, to adapt values of the tap coefficients, via signaling 506, in such a way as to converge to a correct solution.)

Figure 7:
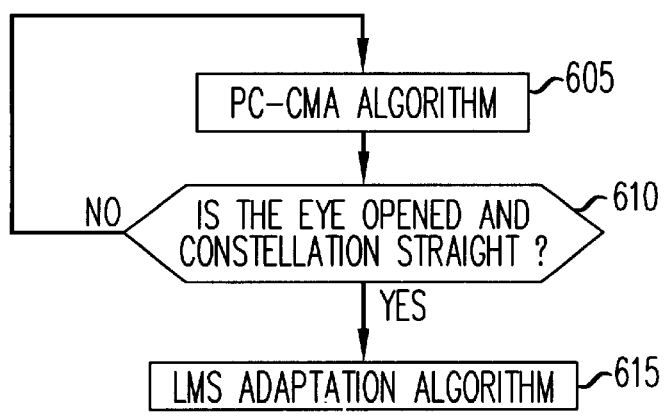
FIG. 7 shows an illustrative blind start-up procedure in accordance with the principles of the invention.

A blind start-up procedure in accordance with the principles of the invention for use in receiver 10 of FIG. 1 is shown in FIG. 7. In step 605, receiver 10 uses the PC-CMA cost function with its corresponding tap updating algorithms to begin blind convergence of an equalizer, e.g., equalizer 510 of FIG. 6. In step 610, a decision is made whether to switch from the PC-CMA algorithm to the LMS adaptation algorithm or to continue using the PC-CMA algorithm to converge the equalizer. Typically, this is referred to in the art as determining if the eye is open enough (as noted above) and if the originally tilted constellation has been derotated to a straight constellation (e.g., by checking if $\Delta\hat{\theta}_n$ from equation (17) is a small number. Step 610 of the blind start-up procedure can be schedule-driven, event-driven, or both. With a schedule-driven approach, the switch between two different tap updating algorithms occurs after some fixed number, M, of iterations (which can be determined by a counter, for example). This approach presumes a certain amount of eye-opening and that the constellation has been adequately rotated after M iterations. With an event-driven approach, the switch occurs when a certain quality of eye opening and constellation rotation is achieved. This can be done, for example, by continuously monitoring values of MSE and $\Delta\hat{\theta}_n$ and making the switch when the values of MSE and $\Delta\hat{\theta}_n$ are below some thresholds. If the eye has been opened enough and the constellation has been adequately rotated, receiver 10 switches to the LMS Adaptation algorithm in step 615.

The foregoing merely illustrates the principles of the invention and it will thus be appreciated that those skilled in the art will be able to devise numerous alternative arrangements which, although not explicitly described herein, embody the principles of the invention and are within its spirit and scope. For example, although the inventive concept was illustrated herein as being implemented with discrete functional building blocks, e.g., FIR 210, etc., the functions of any one or more of those building blocks can be carried out using one or more appropriately programmed processors or processing circuitry, e.g., a digital signal processor; discrete circuit elements; integrated circuits; etc. Also, this technique is not limited to the CMA algorithm. Any blind equalization algorithm that leaves a tilted constellation after convergence can be combined with the phase correction technique described here.

What is claimed:

1. A method for use in a communications receiver, the method comprising the steps of:

equalizing a signal with an adaptive filter; and blindly converging at least one of N tap coefficient vectors of the adaptive filter by using a modified form of a constant modulus based algorithm that uses a tap updating algorithm that includes a phase compensation term.

2. The method of claim 1, wherein the tap updating algorithm corresponds to:

$$C_{n+1}=C_n+\mu\Delta C_n-j\alpha C_n\Delta\hat{\theta}_n$$

where:

$C_n$ is a complex coefficient vector that is input to the tap updating algorithm;

$\mu\Delta C_n$ is a phase-independent coefficient update term;

$j\alpha C_n\Delta\hat{\theta}_n$ is the phase compensation term; and $C_{n+1}$ is a complex coefficient vector that is output from the tap updating algorithm.

3. The method of claim 1 wherein the modified form is phase compensating CMA (PC-CMA).

4. The method of claim 1 wherein the adaptive filter is a phase-splitting equalizer.

5. The method of claim 1 further comprising the step of switching to a least mean square based adaptation algorithm after the blindly converging step.

6. The method of claim 5 wherein the blindly converging step is performed until a calculated error of a received signal is reached, upon which the switching step is performed.

7. The method of claim 5 wherein the blindly converging step is performed until a predetermined amount of time passes, upon which the switching step is performed.

8. Apparatus for use in a receiver, the apparatus comprising:

an adaptive filter having associated N tap coefficient vectors; and circuitry for adapting at least one of the N tap coefficient vectors by using a modified form of a constant modulus based algorithm that uses a tap updating algorithm that includes a phase compensation term.

9. The apparatus of claim 8, wherein the receiver is implemented without using a rotator to rotate a constellation for the signal.

10. The apparatus of claim 8 wherein the modified form is phase compensating CMA (PC-CMA).

11. The apparatus of claim 8 wherein the adaptive filter is a phase-splitting equalizer.

12. The apparatus of claim 8 wherein the circuitry further comprises a processor.

13. Apparatus for use in performing blind equalization in a receiver, the apparatus comprising:

a memory for storing N tap coefficient vectors; and a processor for adapting at least one of the N tap coefficient vectors by using a modified form of a constant modulus based algorithm that uses a tap updating algorithm that includes a phase compensation term.

14. The apparatus of claim 13, wherein the receiver is implemented without using a rotator to rotate a constellation for the signal.

15. The apparatus of claim 13 wherein the modified form is phase compensating CMA (PC-CMA).

16. The apparatus of claim 13 wherein the adaptive filter is a phase-splitting equalizer.

17. The method of claim 1, wherein the communications receiver is implemented without using a rotator to rotate a constellation for the signal.

18. The method of claim 1, wherein the phase compensation term is embedded in the tap updating algorithm for the blindly converging step such that the phase compensation term is not part of any steady-state operations that follow the blindly converging step.

19. The apparatus of claim 8, wherein the phase compensation term is embedded in the tap updating algorithm for the circuitry such that the phase compensation term is not part of any steady-state operations that follow the adapting by the circuitry.

20. The apparatus of claim 8, wherein the tap updating algorithm corresponds to:

$$C_{n+1} = C_n + \mu \Delta C_n - j\alpha C_n \Delta \hat{\theta}_n$$

where:

$C_n$ is a complex coefficient vector that is input to the tap updating algorithm;

$\mu \Delta C_n$ is a phase-independent coefficient update term;

$j\alpha C_n \Delta \hat{\theta}_n$ is the phase compensation term; and $C_{n+1}$ is a complex coefficient vector that is output from the tap updating algorithm.

21. The apparatus of claim 13, wherein the phase compensation term is embedded in the tap updating algorithm for the processor such that the phase compensation term is not part of any steady-state operations that follow the adapting by the processor.

22. The apparatus of claim 13, wherein the tap updating algorithm corresponds to:

$$C_{n+1} = C_n + \mu \Delta C_n - j\alpha C_n \Delta \hat{\theta}_n$$

where:

$C_n$ is a complex coefficient vector that is input to the tap updating algorithm;

$\mu \Delta C_n$ is a phase-independent coefficient update term;

$j\alpha C_n \Delta \hat{\theta}_n$ is the phase compensation term; and $C_{n+1}$ is a complex coefficient vector that is output from the tap updating algorithm.

* * * * *